(12) United States Patent
Schuttert

(10) Patent No.: US 7,447,963 B2
(45) Date of Patent: Nov. 4, 2008

(54) TESTING OF ELECTRONIC CIRCUITS

(75) Inventor: Rodger Frank Schuttert, Eindhoven (NL)

(73) Assignee: NXP B.V., Eindhoven (NL)

( * ) Notice: Subject to any disclaimer, the term of this patent is extended or adjusted under 35 U.S.C. 154(b) by 704 days.

(21) Appl. No.: 10/545,735

(22) PCT Filed: Feb. 5, 2004

(86) PCT No.: PCT/IB2004/050075

§ 371 (c)(1),
(2), (4) Date: Aug. 16, 2005

(87) PCT Pub. No.: WO2004/075250

PCT Pub. Date: Sep. 2, 2004

(65) Prior Publication Data

US 2006/0150042 A1    Jul. 6, 2006

(30) Foreign Application Priority Data

Feb. 18, 2003    (EP)    .................................. 03100370

(51) Int. Cl.
*G01R 31/28*    (2006.01)
(52) U.S. Cl. ..................................... 714/731
(58) Field of Classification Search ....................... None
See application file for complete search history.

(56) References Cited

U.S. PATENT DOCUMENTS

| | | | |
|---|---|---|---|
| 5,132,635 A * | 7/1992 | Kennedy ..................... 324/763 |
| 5,343,478 A * | 8/1994 | James et al. ................ 714/726 |
| 5,606,566 A | 2/1997 | Whetsel |
| 5,768,289 A * | 6/1998 | James ......................... 714/727 |
| 5,790,561 A * | 8/1998 | Borden et al. ............... 714/724 |
| 2001/0037480 A1 * | 11/2001 | Whetsel ...................... 714/727 |
| 2002/0095633 A1 * | 7/2002 | Pillkahn ..................... 714/734 |
| 2002/0168015 A1 | 11/2002 | Whetsel |

* cited by examiner

*Primary Examiner*—Jacques H Louis-Jacques
*Assistant Examiner*—Steven D Radosevich
(74) *Attorney, Agent, or Firm*—Peter Zawilski

(57) ABSTRACT

A plurality of integrated circuits that are used in an electronic circuit have functional interconnections and dedicated test connections. The integrated circuits receive and transmit synchronization information, such as clock signals from one integrated circuit to another successively through the chain. This permits a high-test speed. Preferably the synchronization information is serialized with test data, test results and/or commands. Preferably, the bit rate between successive integrated circuits in the chain is programmable by means of commands transmitted through the chain. Thus, different bit rates may be at different locations along the chain to reduce the delay occurred by the synchronization signals along the chain.

27 Claims, 3 Drawing Sheets

TESTING OF ELECTRONIC CIRCUITS

BACKGROUND OF THE INVENTION

U.S. Pat. No. 5,606,566 describes a circuit test technique that uses the IEEE1149.1 test standard. A circuit contains a plurality of integrated circuits with functional interconnections to communicate signals between the integrated circuits during normal operation. The circuit is tested by entering test signal into the circuit and observing how the circuit responds to the test data. The interconnections between the integrated circuits, for example, are tested by applying test signals at the output of the integrated circuits and observing whether corresponding response signals arrive at the inputs of the integrated circuits.

The IEEE1149.1 standard, as described in U.S. Pat. No. 5,606,566 defines a test interface for entering the test signals into the circuit and reading the response signals from the circuit. A one-bit wide shift structure is used for this purpose. The integrated circuits are connected in a chain of successive integrated circuit. Each integrated circuit has one test data input terminal coupled to its predecessor in the chain, if any, and one test data output coupled to its successor in the chain, if any. In addition the integrated circuits have test clock and test mode select inputs coupled in common.

Successive bits of the test signals are applied to the test data input of the chain and shifted from integrated circuit to integrated circuit in the chain to the integrated circuit from where the test signal is output to test the functional interconnections. Similarly, the response signals are loaded into the integrated circuit from the functional interconnections and successive bits of the response signals are shifted from integrated circuit to integrated circuit in the chain to a test data output. Control instructions are similarly shifted through the chain. Shifting, outputting and loading is synchronized by a central clock that is coupled to the test clock inputs of the integrated circuits and controlled by a mode select signal that is coupled to the test mode select inputs of the integrated circuits. The mode select signal controls how the test interface traverses a state diagram of the test interface.

The IEEE1149.1 standard is based on a compromise between access speed and pin/connection count. Only two test data pins are needed per integrated circuit, and only one test data connection to another integrated circuit. In return, it takes a long time to write or read test data, because the data and instructions have to pass through a chain of integrated circuits.

Various techniques have been proposed to increase the access speed of IEEE1149.1 interfaces U.S. Pat. No. 5,606,566, for example, proposes to use several chains in parallel. A method of improving speed is of course to increase the speed of the test clock. But there are limits to the maximum clock speed, not only in terms of maximum internal speed of the integrated circuits, but also due differences between the delays introduced by the connections from the central clock source to the different integrated circuits. The differences between these delays are referred to as clock skew. These should not exceed the length of the clock period.

SUMMARY OF THE INVENTION

Among others, it is an object of the invention to realize a high clock speed in a test interface of a circuit.

Among others, it is an object of the invention to reduce the time needed for testing circuits.

The invention provides for a system according to claim 1. A chain connection between the integrated circuits is used for communicating test information to test functional interconnections between different integrated circuits. According to the invention synchronization information, such as a test clock signal, that determines when test data is output by the integrated circuits to the functional interconnections and captured from the functional interconnections by the integrated circuits is transmitted through the chain from one integrated circuit to another. This eliminates problems due to discrepancies between the delay of arrival of the test synchronization information and the test data at the integrated circuit. Preferably all integrated circuits in the chain receive their synchronization information, such as clock signals, through the chain, but without deviating from the invention further integrated circuits may be added that receive a central synchronization information, be it from the tester, for example when these further integrated circuit are at the front of the chain, or from a local synchronization information supply circuit for a plurality of successive circuits in the chain, where the local synchronization information is derived from clock signals received via the chain.

Preferably the integrated circuits replace test data, which initially travels with synchronization information at the input of the chain, by test results that travels with that synchronization information to the output of the chain. Thus, the amount of time needed to perform a test is reduced. Also preferably, the synchronization information includes state selection information common for all integrated circuits in the chain. In this case, the integrated circuits in the chain are each arranged to step through a series of states, wherein successive states are selectable under control of the synchronization information indiscriminately for all integrated circuits in the chain. Reaching particular states triggers update and capture. The state diagram defined for the IEEE1149.1 standard may be used for example. Thus, the integrated circuits in the chain collectively can flexibly adapt the sequence of states.

Preferably, a tester coupled to the chain ensures that the rate at which the synchronization information is updated is so low that all integrated circuits in the chain receive synchronization information that causes an update of the test signals applied to the functional interconnection before a first integrated circuit in the chain receives synchronization information that causes a capture. The tester may for example determine the required delay on the basis of information about the integrated circuits in the chain, but preferably the tester measures whether synchronization that causes the update has arrived at the end of the chain and transmits the synchronization information that causes the update only after such a measurement.

Preferably, the synchronization information is transmitted temporally in series with the test data, test results and/or commands through a same communication conductor from one integrated circuit to another. Thus a minimum of connecting pins has to be provided for test purposes and different skew is avoided. Preferably a pair of pins is used between each pair of integrated circuits to transmit the information as a differential signal. This increases the maximum possible speed. In addition, it makes it possible to use integrated circuits with mutually different supply voltages.

In an embodiment the integrated circuits receive and transmit successive words that contain the synchronization information temporally in series with the test data, test results and/or commands. The integrated circuits copy the synchronization information received from a received word to a transmitted word and replace a received bit of the test data, test results and/or commands from the received word in the transmitted word by an internal bit of the test data, test results and/or commands, produced in the integrated circuit. The internal bit is for example a bit of test data or a test result from an earlier word that has traveled through the integrated circuit or a test result that has been captured in the integrated circuit. Thus, a minimum transmission delay is realized for the synchronization information (and thereby a maximum test speed), while permitting processing of test data in the integrated circuit.

In a further embodiment at least one of the integrated circuit comprises a test controller circuit is connected to the chain via a shell that makes it appear as if the serially transmitted bits of synchronization data and test data, test results and/or commands arrive in parallel. Thus, a conventional test controller, such as an IEEE1149.1 tap controller may be used in combination with chained transmission of clock signals.

In another embodiment, the words that contain the synchronization and test data contain additional positions for programming information for selected integrated circuits in the chain. For example, the programming information may be used to supply successive edges in write enable signals for a programmable memory, following n words (n=16 for example) in which test data has been supplied that serves as information that has to be written in parallel into the memory.

In an embodiment at least part of the integrated circuits allows for programmable bit rates of reception and transmission of test data and synchronization information. Initially the bit rates are set to a predetermined value in an initial state. But the bit rates are reprogrammed under control of an integrated circuit specific command received via the chain. Integrated circuits in the circuit under test may have different maximum possible speeds. Dependent on the circuit under test, successive integrated circuits in the chain may have the same maximum possible speeds or different maximum possible speeds. A tester has information about the successive integrated circuits in the chain and their maximum possible speeds. Initially all integrated circuits use a predetermined bit rate that is acceptable for all. Afterwards the tester may set the bit rate to different values at different points along the chain, as maximally permitted between successive pairs of integrated circuits. Thus, the delay experienced by the synchronization information is minimized, which maximizes test speed.

In an embodiment integrated circuits in the chain have of said at least part of the integrated circuits each have an external clock input terminal for initially clocking transfer of data along the chain from a central clock to which all clock input terminals are coupled in common. In this case, a command may be supplied to switch to chained transmission of synchronization information, such as the clock signal, at a much higher bit rate.

In another embodiment integrated circuits of the chain have external reset input terminals coupled in common to a central reset input to reset to the bit rate that is acceptable for all integrated circuit.

BRIEF DESCRIPTION OF THE FIGURES

These and other objects and advantageous aspects of the invention will be described in more detail using the following figures.

DETAILED DESCRIPTION OF THE INVENTION

Figure 1:
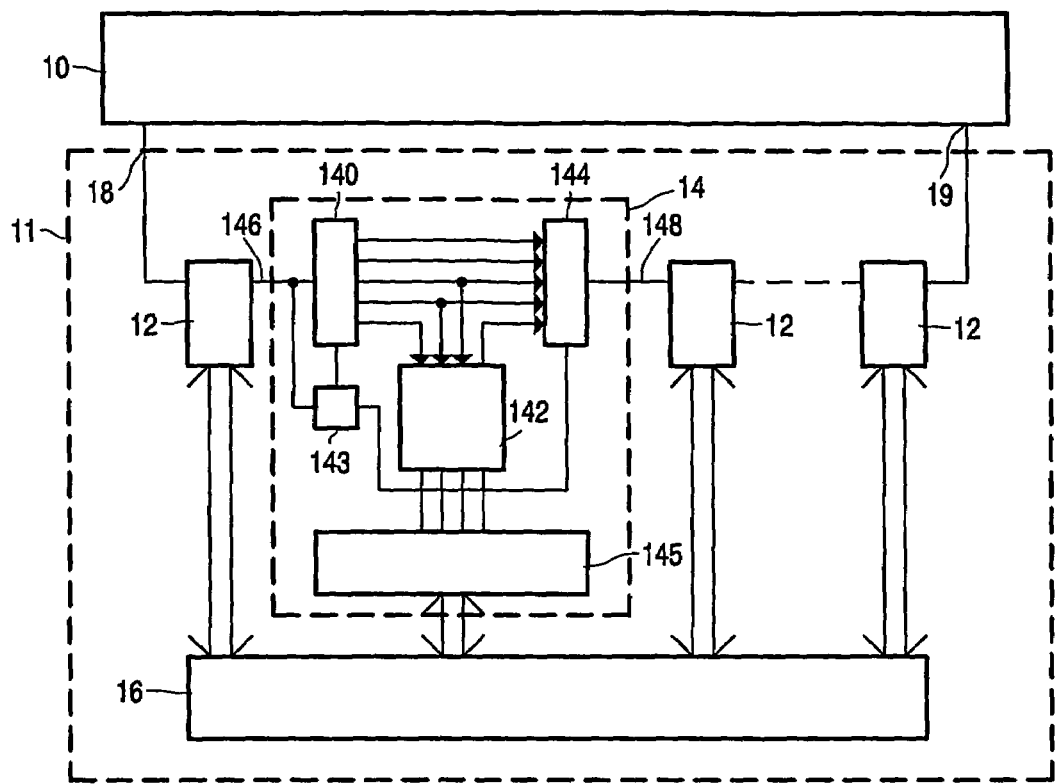
FIG. 1 shows a test system.

FIG. 1 shows an embodiment of a test system. The system contains a tester 10 and a circuit under test 11. Circuit under test 11 contains a number of integrated circuits 12, 14 interconnected by some functional interconnection circuit 16. For test purposes integrated circuits 12, 14 are also connected in a chain that has an input 18 coupled to an output of tester 10 and an output 19 coupled to an input of tester 10. The connections between pairs of successive integrated circuits 12, 14 in the chain are communication connections for transmitting a single bit at a time, e.g. each a single conductors or a pair of conductors used for differential signal transmission.

In normal operation circuit 11 is not connected to tester 10. In normal operation functional circuits in integrated circuits 12, 14 perform various functions for which circuit 11 has been designed and communicate information via functional interconnect circuit 16. Generally speaking, functional interconnect circuit 16 includes a set of conductor lines that provide for point-to-point connections between terminals of integrated circuits 12, 14 (plus optionally some glue logic). In general these connections do not follow the chain-like nature of the test chain: functional interconnect circuit 16 may an integrated circuits at any positions along the chain and often an integrated circuits will have inputs and/or outputs connected to several other integrated circuits, not just one such as in the chain.

In order to test circuit 11 it is connected to tester 10. Tester 10 enters test data into the integrated circuits 12, 14 and reads responses to this test data as test results from the integrated circuit. Before and after the actual test the test, data and results enter and leave the circuit 11 along the chain, i.e. along a path that is independent of the functional interconnection circuit 16. In particular the functional interconnection circuit does not generally have the same chain structure. Hence it is not generally the case that, when a test signal arrives at a first integrated circuit after transmission from a second integrated circuit through the chain, all functional signals will travel through functional interconnection circuit from the first integrated circuit to the second integrated circuit as well and with the same delay. On the contrary, some functional signals may travel in the opposite direction and with different transmission delays.

Typically, circuit under test 11 also comprises a carrier (not shown), such as a printed circuit board on which functional connections 16, as well as the connections for the test chain, are implemented and to which the integrated circuits are attached. In this case, testing is used to test functionality of the circuit on the carrier. In other circumstances circuit 11 under test may comprise an interconnected system of a plurality of such carriers.

One of the integrated circuits 14 is shown in more detail (the other integrated circuits 12 may have a similar structure). Integrated circuit 14 contains a receiver 140, a transmitter 144, a test controller 142, a clock circuit 143 and a functional circuit 145. Receiver 140 has an input 146 coupled to a predecessor integrated circuit 12 in the chain. Receiver 140 has outputs for a test clock signal TCK, a test mode signal TMS and a test data signal TDI and further outputs. The outputs for test clock signal TCK and test mode signal TMS are coupled to test controller 142 and transmitter 144. Test controller 142 has a test data input coupled to the test data output of receiver 140 and a test data output coupled to transmitter 144. Transmitter 144 has an output 148 coupled to a successor integrated circuit in the chain. Functional circuit 145 is coupled to the other integrated circuits 12 via functional interconnection circuit 16 and to test controller 142.

In operation in a test mode tester 10 outputs words of test data and/or test instructions, combined with test clock signals and mode select signals to the chain of integrated circuits 12, 14 via output 18. Each integrated circuit 12, 14 receives the words of test data and/or test instructions combined with test clock signals and mode select signals from its predecessor in the chain and transmits words of test data and/or test instructions combined with test clock signals and mode select signals to its successor. In integrated circuit 14 receiver 140 receives words of successive bits of information from input 146 and decodes a test clock signal TCK, a mode select signal TMS, an input data bit TDI and optional further bits from each word. Receiver 140 applies the test clock signal TCK, the mode select signal TMS and the input data bit TDI to test controller 142. Test controller 142 may be a conventional IEEE1149.1 test controller. Test controller 142 passes signals to functional circuit 145, for example to shift test data through a shift register chain, to update data in flip-flops that output test data to functional interconnect circuit 16, or to capture response signals from functional interconnect circuit 16. Test controller 142 outputs a test data output bit, which is typically either a bit that has been previously received as a test data input bit or a bit of response data captured from functional circuit 145 or from functional interconnect circuit 16.

Transmitter 144 receives the test clock signal TCK, the mode select signal TMS from receiver 140 and the test data output bit from test controller 142. Transmitter 144 combines the test clock signal TCK, the mode select signal TMS from receiver 140 and the test data output bit together with the optional further bits into a word that is transmitted serially to a successor in the chain of integrated circuits 12, 14. Thus, transmitter 144 combines the test clock signal TCK and the mode select signal TMS will be transmitted from integrated circuit 14 generally with one word delay after reception from the integrated circuit 14.

Clock circuit 143 reconstructs a clock signal from the signals transmitted via serial input 146 for clock receiver 140 and transmitter 144. The clock signal is used for decoding and encoding serial data in receiver 140 and transmitter 144. As an alternative, handshaking may be used between the transmitter and receiver of successive integrated circuits 12, 14, but this requires more connections.

As a result the test clock signal TCK, the mode select signal TMS from receiver 140 and the test data output bit are transferred between each pair of successive integrated circuits 12, 14 in the chain, and used in parallel inside the integrated circuits 12, 14. Because all these test signals are transmitted through a single chain of integrated circuit no clock skew problems arise.

The test controllers 142 of the different integrated circuits in the chain are designed to operate in cooperation with each other, all stepping through a same, selectable series of test states and passing test data or instructions to integrated circuits further down the chain or passing response data from integrated circuits in the preceding part of the chain. The test clock signal and the test mode select signal control the states assumed by the test controllers, for example using a state diagram compatible with the IEEE1149.1 test standard. The state diagram defines, among others, update and capture states. In response to reaching the update state test controller 142 commands update flip-flops (not shown separately) to copy test data or instruction data received via the chain in order to output the test data or instruction data. In response to reaching the capture state test data is loaded for shift out through the chain.

Tester 10 controls when a word with a new test clock signal value is transmitted through the chain. Preferably the word with the old clock signal value is repeated until the word with the new test clock signal value is transmitted. This permits clock circuit 143 to remain locked to the bit rate and reduces the effect of missed words.

Generally, tester will transmit a word with a new clock signal value after a delay, corresponding for example to a series of N words with the old clock signal value. The delay is selected so that a minimum time interval from update to corresponding capture by different integrated circuits is preserved, as well as a minimum time interval from capture to next update. That is, before tester 10 outputs a word with a new clock signal value that will cause an update, a word with the clock signal value that causes the preceding capture must have arrived at the last integrated circuit in the chain, so that all integrated circuits will have executed the capture. Vice versa, before tester 10 outputs a word from a next series with a next different test clock signal value that will cause a capture, a word with the clock signal value that causes the preceding update must have arrived at the last integrated circuit in the chain, so that all integrated circuits will have executed the capture.

Various techniques may be used to ensure that the delay during which the test clock signal does not change is sufficient to ensure the existence of such a time interval. In one embodiment, tester 10 monitors words received from the chain at input 19 and decodes the test clock signal received from these words. In this embodiment tester 10 changes the clock signal in the words at output 18 only once tester 10 detects that the previous change of the clock signal has arrived at input 19. Thus it is ensured that there will always be a time interval in which all integrated circuits 12, 14 are in the same state, which ensures proper sequencing of updates and captures. In a more aggressive embodiment tester 10 at least delays outputting of words with a new clock signal that causes transitions to update or capture states until a word with the clock signal transition after a preceding capture and update has been received at input 19 respectively.

In another embodiment, a programmed value of the delay (e.g. of the number of words N that must be repeated) may be used as appropriate for a circuit 11 under test, or a required value of the delay may be determined once for a number of series of words from a measurement of the delay of the chain of a circuit under test.

Although FIG. 1 assumes that all integrated circuits 12, 14 in the chain receives synchronization information such as a clock signals and/or a mode select signal through the chain, this is not in fact necessary. Without deviating from the invention one or more further integrated circuits may be added to the chain that receive a central synchronization information from the tester. For example such further integrated circuit may be included at the front of the chain, receiving their clock signals etc. centrally from tester 10. In this case the last integrated circuit preferably is arranged to generate and supply words with synchronization information and data, results or commands to the remainder of the chain, from the centrally received synchronization information and its local data, results or commands. When the central synchronization information can be passed to this part of the integrated circuits with little skew this still permits a high test speed.

In another alternative a local group of a plurality of successive circuits in the chain may in common receive local synchronization information from a local synchronization information supply circuit. In this case the local synchronization information supply circuit derives synchronization from the chain at the start of the group and supplies this derived synchronization information (e.g. a test clock signal) to the integrated circuits of the local group. Preferably, a local synchronization passing circuit combines data, results and command output at the end of the chain with the locally generated synchronization information and passes the combined information through the chain to further integrated circuits.

Thus an "island" of conventional centrally test clocked integrated circuits may be incorporated in the chain. Effectively, the "shell" created around test controller 142 in one integrated circuit 14 in this case extends around a plurality of conventional integrated circuits. The local synchronization information supply circuit and the local synchronization passing circuit that interface to the remainder of the chain have functions similar to receiver 140 and transmitter 144 and may be incorporated in integrated circuits at the start and end of the island, or even in one integrated circuit that is included at two positions in the chain at the start and end of the island. When the integrated circuits in the island can be clocked with little skew, test speed is still high.

Figure 2:
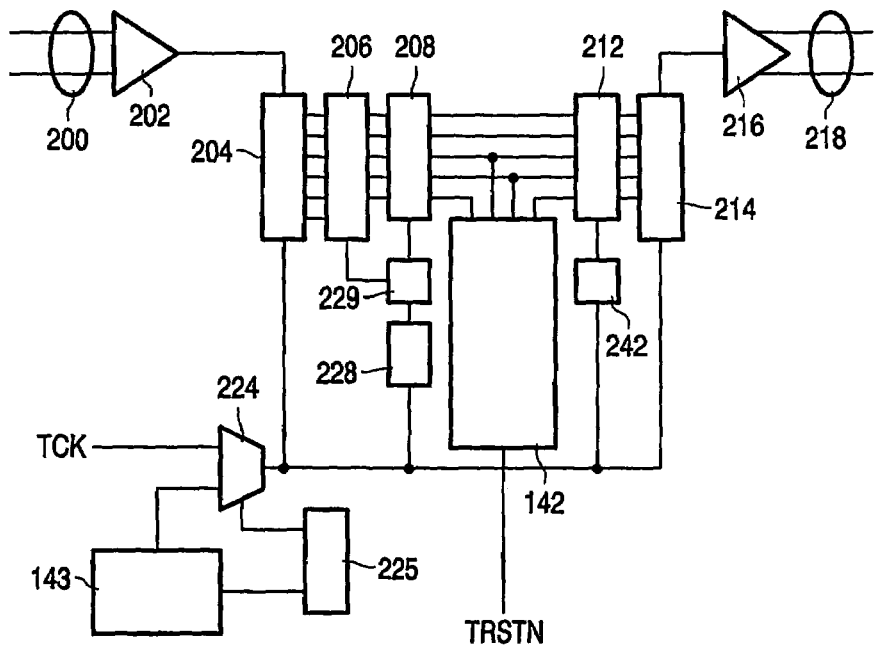
FIG. 2 shows an integrated circuit.

FIG. 2 shows a more detailed embodiment of an integrated circuit. The integrated circuit has an external test reset signal input TRSTN coupled to test controller 142. The reset inputs of different integrated circuits are generally coupled in common to a central reset source, that is, not through a chain structure. The integrated circuit has a differential test signal input 200 and a differential test signal output 218. Furthermore, the circuit contains an input sense amplifier 202, an input shift register 204, an input decoder 206, an input latch 208, in series between differential input 200 and test controller 142. An output encoder 212, an output shift register 214 and an output driver 216 are coupled between test controller 142 and differential output 218. Outputs of input latch 208 for a test clock signal and a test mode select signal are coupled to output encoder directly, in parallel with test controller 142.

In addition to clock circuit 143 an external clock input TCK is provided. An output of clock circuit 143 and clock input TCK are coupled to inputs of a multiplexer 224. An output of multiplexer 224 is coupled to clock inputs of input shift register 204 and input latch 206, the latter via a counter 226 and an enable circuit 229. Enable circuit 229 has an enable input coupled to an error signal output of input decoder 206. The output of multiplexer 224 is coupled to a shift clock input of output shift register 214 and to a load input of output shift register 214, the latter via a count and delay circuit 242. Multiplexer 224 and clock circuit 143 are controlled by a control register 225, which is in fact part of test controller 142, but is shown separately for the sake of clarity.

In operation, test controller 142 is initially reset to a reset state using reset input TRSTN. During operation the words with the test clock signal, the test mode signal and the test input data arrive at differential input 200. Successive bits of the words are sensed and loaded into input shift register 204. The bits are output in parallel from input shift register 204 to input decoder 206. Assuming that the number of bits per transmitted word is "n" (n=6 for example) a decoding result is latched into input latch 208 from input decoder 206 every n clock cycles, provided that input decoder 206 indicates that no error has occurred. By way of example, input decoder 206 decodes five bits from a six bits word using some error detecting code.

The bits latched into input latch 208 include a bit representing the test clock signal, a bit representing the test mode select signal, a bit representing the test data input and optional further bits. The test clock signal, the test mode select signal, and the test data input are fed to test controller 142 and used as conventional IEEE1149.1 test signals TCK, TMS and TDI. In response to these signals test controller produces successive test data output signals (TDO), at successive TCK level transitions. The TDO signal typically derives either from an earlier TDI value or from a test result captured from circuit 11, for example from functional interconnect circuit 16. Test controller 142 continues outputting the same TDO value at least while TCK remains at the same logic level.

Output encoder 212 receives TCK and TMS as well as optional further bits from input latch 208 and TDO from test controller 142. Output encoder 212 forms bits of an output word from these signals, typically performing the inverse of the decoding performed by input decoder 206. The encoded bits are loaded into output shift register 214, preferably at the same frequency as with which data is loaded into input latch 208 (every n clock cycles), but with a delay of a number of clock cycles so that the data is loaded into output shift register 214 with sufficient after loading input latch 208, so that the TDO value corresponding to the TCK and TMS values in that latch is available at the output of test controller 142. Output shift register 214 shifts the encoded bits to driver 216, which drives differential output 218.

Any desirable form of encoding and decoding may be used. For example a parity bit may be added to the test clock signal, the test mode select signal, the test data and the optional further bits. Similarly start and/or stop bits may be added, or other information that facilitates identification of word boundaries. In this case a word boundary detection circuit may be used to detect word boundaries from the incoming bits and to control loading into input latch 208 and output shift register 214. Similarly the encoding may be adapted to facilitate frequency recovery from the transmitted data, for example by ensuring a minimum number of signal transitions in the words, and/or the encoding may be adapted to service certain channel characteristics, for example by ensuring that there are as many bits of one value as of the opposite value.

Although input decoder 206 and output encoder 212 are shown without clock input, it will be appreciated that clocked decoders and/or encoders may be used, for example for computing parity by exoring a stored intermediate parity successive with successive incoming bits.

Clock multiplexer 224 makes it possible to choose between using an external clock and an internal clock from clock circuit 143. The external clock is preferably supplied to al integrated circuits 12, 14 in parallel, that is, not via a chain structure but from a central source, for example in tester 10. This limits the maximum usable external clock value to a much lower value than that of clock circuit 143. After reset, the external clock is selected. At this stage tester 10 supplies test data through the chain at the frequency of the external clock. At this stage the external clock is used to initialize the integrated circuits and in particular to load control register 225 with instruction data supplied via input 200. The instruction data sets the nominal frequency of clock circuit 143 and commands clock multiplexer 224 to switch to the internal clock circuit 143. Subsequently the content of control register 225 generally remains unchanged during the test, but it may be updated using instruction data received under control of clock circuit 143.

However, it should be appreciated that the initial use of an external clock is merely a convenient solution, to ensure initialization. Without deviating from the invention the clocks signals may initially be supplied through the chain as well at a low bit rate so that all integrated circuits are capable of handling the bit rate.

Figure 3:
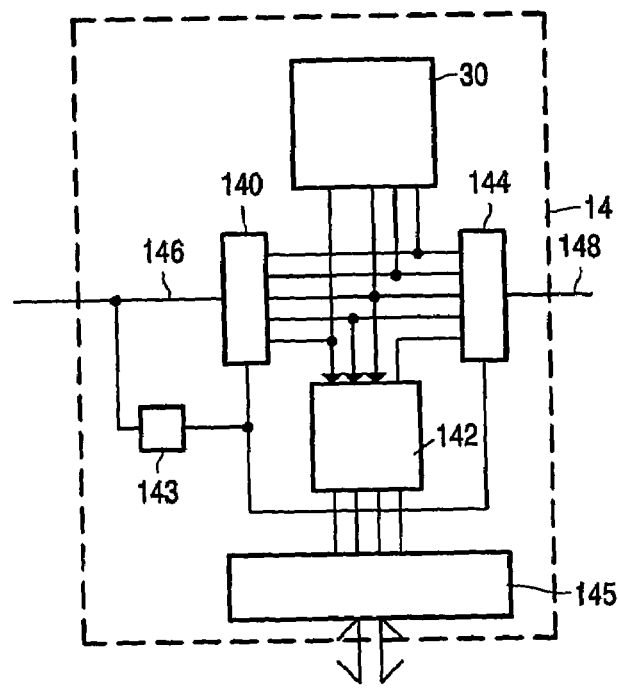
FIG. 3 shows an integrated circuit with a programmable memory.

FIG. 3 shows an integrated circuit with a programmable memory 30, for use in the chain of circuit 11 of FIG. 1. The outputs for further bits from the words received via test input 146 are coupled to memory 30, as well as the output for the incoming test data. In the embodiment of FIG. 3 memory 30 is clocked by the test clock signal derived from the received words. In operation, memory 30 is programmed using data supplied as test data. After transmitting a memory word of data (e.g. 16 bits) the further bits are used to generate a write enable pulse to cause the received data to be written into memory 30. Successive levels of the write enable signal may be encoded in words with successive clock signal values. This has the advantage that programming of the memory can be controlled by the test signals and that transmission of the further bits is not affected when certain integrated circuits do not copy all words to their output.

In principle new write enable signals may be supplied in every new word, even if the test signals, such as TCK and TMS remain unchanged in the new words. Thus memory 30 can be programmed quickly.

Figure 3A:
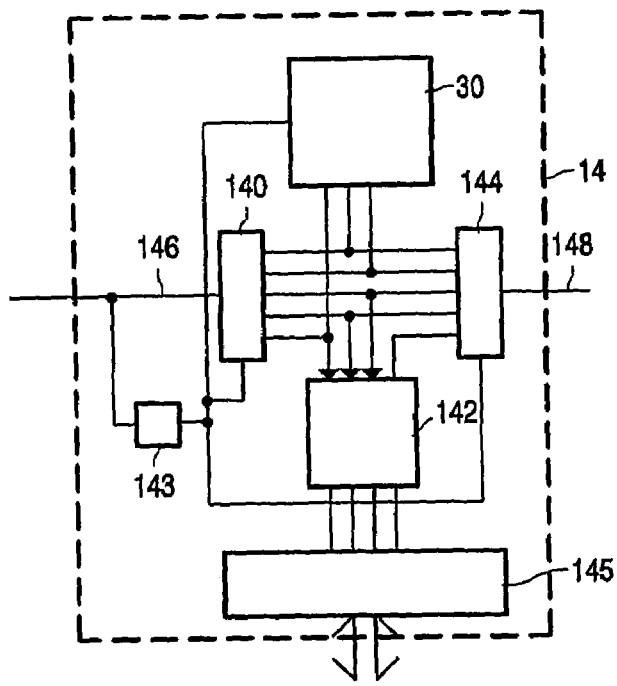
FIG. 3a shows an integrated circuit with a programmable memory.

FIG. 3a shows an embodiment in which new data that has to be written is be supplied in every word transmitted via the chain, clocked by clock circuit 143 instead of by the received test clock signal. This speeds up programming. If the data is included as test data, which is also supplied to test controller 142, this may be incompatible with the operation of test controller 142, in this case test controller 142 is preferably switched to a state where this has no effect during memory programming. In an alternative, data to be programmed into memory 30 may be supplied as further bits from the received words.

Figure 4:
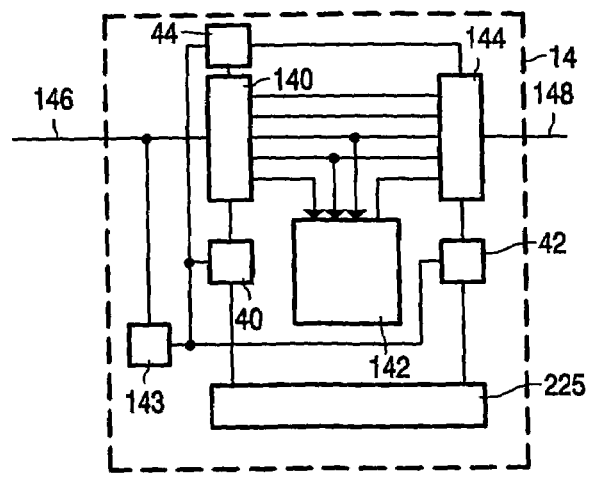
FIG. 4 shows an integrated circuit with partially independent clock circuits.

FIG. 4 shows an integrated circuit with partially independent clock circuits 40, 42 for input and output of words with test signals. Both clock circuits 40, 42 derive their clock signals from a retrieved clock signal from clock circuit 143. The clock frequencies output by the clock circuits 40, 42 are independently programmable using control register 225. Clock circuits 40, 42 control the bit rates of reception and transmission at input 146 and output 148 respectively. In operation this permits use of a circuit 11 with integrated circuits capable of operating at disparate speeds. Different parts of the chain may pass words at different clock rates, under control of frequencies programmed into the control register 225 of different integrated circuits in the chain. Preferably, a delayed disable circuit 44 is included to ensure that a word for transmission is latched into transmitter 144 with a predetermined delay after a new word has been output from receiver 140, so as to permit controller 142 to output a test data output signal in response to the new word before the word for transmission is latched into transmitter 144. For this purpose, a signal indicating output of a new word is preferably supplied from receiver 140 to transmitter 144 via disable circuit 44, to block latching of a new word at transmitter 144 for a predetermined number of clock periods of clock source 143 after reception and output of a new word by receiver 140.

By using different programmable clock frequencies the delay experienced by the test signals when they travel through the chain can be minimized, by having pairs of successive integrated circuits in the chain operate at or near the minimum of the maximum possible speeds of the respective integrated circuits of the pair. Given the integrated circuits used in circuit 11 under test, it can readily be determined which clock speeds may be used. The selected frequencies are then encoded in frequency programming data transmitted by tester 10 via the chain, to load the frequency programming data into control register 225. Because the delay with which test signals such as TCK travel through the chain is thus minimized, the frequency with tester 10 may change the test signals can be increased. It will be understood that a similar increase in speed can be realized by using asynchronous handshakes between the integrated circuits in the chain, but for this more input pins will generally be required.

Although clock circuits 40, 42 are shown to use a common clock source 143, it will be understood that output clock circuit 42 may be completely independent. In this case, it measures to control transfer between different clock domains may be needed. In yet another embodiment handshake signals may be used to transfer data from the words between different integrated circuits and inside the integrated circuits. In this case, no clock programming is needed to achieve optimal speed.

Figure 4A:
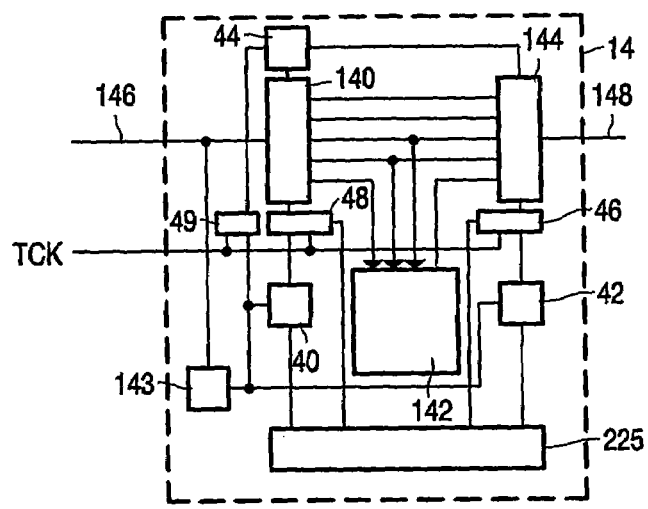
FIG. 4a shows an integrated circuit with partially independent clock circuits.

FIG. 4a shows a further embodiment, wherein multiplexers 46, 48, 49 have been added to permit selection between using internal clock 143 and an external clock input, for connecting the integrated circuits in common to an central external test clock source. Multiplexers 46, 48, 49 are controlled by command data from control register 225. Thus, it is possible to use a central clock initially and to switch to clock information that has been passed through the chain later.

In another embodiment strobe signals may be used between the integrated circuits to permit clock recovery. Strobe signals are known per se. For example a strobe signal and a data signal may be selected so the strobe signal makes a transition when data from the words to be transmitted is logic one and the data signal makes a transition when the data to be transmitted is logic zero. In this case the recovered clock is the exclusive or of the data and strobe signal. This permits a high data rate for relatively low strobe and data signal bandwidths. At intervals, the coding may change to mark word boundaries through phase jumps in the recovered clock signal.

Although the invention has been described in terms of the IEEE1149.1 standard, using conversion of words transmitted through a chain of integrated circuits to recover test clock signals and test mode select signals as well as test data, it will be understood that the invention is not limited to the application to IBEE1149.1. Other test protocols may be used. Similarly, although an advantageous embodiment effectively adds a shell around a test controller that treats certain test signals, such as TCK and TMS, as centrally supplied signals, so that the shell retrieves these signals from signals supplied through a chain, it will be appreciated that other embodiments are possible, in which the chained transmission of these signals is not hidden from test controller.

As shown, the test synchronization signals TCK, TMS are transmitted as part of words that are transmitted bit serially. As an alternative, one or more of these signals may be transmitted in parallel through the chain. By using the same chain, clock skew problems are avoided. Serial transmission, however, has the advantage of reducing the number of input terminals that must be provided for test purposes, without unduly decreasing test speed, because the test speed is ultimately determined by the fact that the synchronization signals change only at a rate needed to ensure that capture and update of different integrated circuits in the chain occurs in the correct order. Thus, transmission of several signals serially does not significantly affect speed.

As also shown, only one bit of test data is included in each word, so that only one bit is loaded into test controller 142 and output from controller when the test synchronization signals, such as TCK and TMS, change. This is compatible with IEEE1149.1. In an alternative embodiment the words contain more than one test data bit, the data bits from a word being loaded into test controller 142 or output from test controller 142 in parallel.

As also shown, the test data is made to change only when the test synchronization signals, such as TCK and TMS, change. As an alternative, the test data may change more frequently, so that successive words that contain the same TCK and TMS bits contain different TDI or TDO bits.

Figure 5:
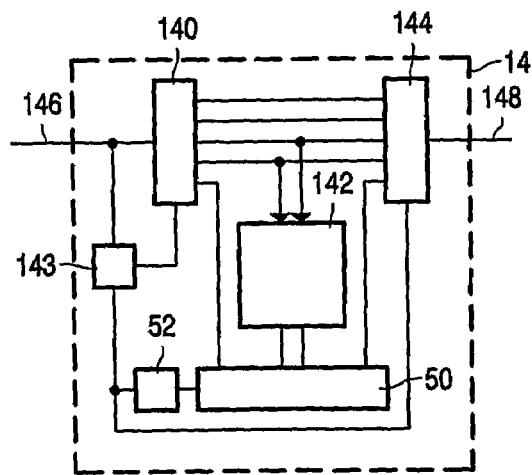
FIG. 5 shows an integrated circuit.

FIG. 5 shows an integrated circuit that makes use of more frequent changes of test data. The integrated circuit contains a shift register 50 which may be any one of the shift registers for TDI/TDO data used in IEEE1149.1 for example. An output of receiver 140 for outputting test data TDI is coupled to an input of shift register 50. An output of shift register 50 is coupled to transmitter for supplying test bits for transmission of test data TDO. In a further embodiment more than one test data bit may be loaded into shift register 50 in parallel or output from shift register 50 in parallel per data word.

Shift register 50 receives clock signals from clock circuit 143 via clock supply circuit 52. Thus, data is shifted through shift register 50 at a higher rate than the rate of test clock signal TCK. Apart from its input and output and clocking, shift register is controlled using the internal test synchronization signals (TCK and TMS) that have been recovered. These synchronization signals control for example updating with data from shift register 50 and capture into the shift register 50.

In an embodiment clock supply circuit 52 passes clock pulses at a divided clock rate so that for each word received at input 146 one clock pulse is passed. However, when it is not the case that new test data is supplied in each successive word clock supply circuit 52 may further reduce the number of passed clock pulses, for example to one clock pulse for every two words if every second word contains a new test data bit. In a further embodiment, tester 10 may include information, such as a bit counter, in the words to indicate whether the word contains new test data. In this case this information is used to control whether clock supply circuit passes a clock pulse.

The embodiment of FIG. 5 permits more frequent changes of test data than synchronization data such as TCK and TMS. This has the advantage that more test data can be transmitted per test clock TCK period. However, this may lead to problems when the chain contains some integrated circuits that are slower than others. In this case words are preferably exchanged at a higher rate between fast integrated circuits in the chain and at a lower rate with slower circuits. Thus, fewer successive words with the same synchronization information are exchanged with slower integrated circuits than between faster integrated circuits. This may make it unpredictable when test data is passed and when not when the test data changes more frequently than the synchronization information. In an embodiment therefore, the test data changes only when the synchronization data to ensure complete transmission of test data in a simple way.

The invention claimed is:

1. An electronic circuit comprising:
   a plurality of integrated circuits, each comprising a test control circuit, switchable between a test mode and a normal operating mode;
   functional connections between the integrated circuits;
   test communication connections in addition to the functional connections and forming a chain that includes the integrated circuits, the integrated circuits being arranged to receive and transmit, from one integrated circuit to another successively through the chain, test data, test results and/or commands together with synchronization information, for timing output of the test data to the functional connections and capture of the test results from the functional connections.

2. An electronic circuit according to claim 1, wherein each integrated circuit in the chain is arranged to step through a series of states, wherein successive states are selectable under control of the synchronization information indiscriminately for all integrated circuits in the chain, the states determining sequencing of update and capture.

3. An electronic circuit according to claim 1, wherein the integrated circuits are arranged to transmit the synchronization information temporally in series with the test data, test results and/or commands through a same communication conductor from one integrated circuit to another in the chain.

4. An electronic circuit according to claim 3, wherein each integrated circuit in the chain receives and transmits successive words that contain the synchronization information temporally in series with the test data, test results and/or commands, the integrated circuits being arranged to copy the synchronization information received from a received word to a transmitted word and to replace a received bit of the test data, test results and/or commands from the received word in the transmitted word by an internal bit of the test data, test results and/or commands, produced in the integrated circuit.

5. An electronic circuit according to claim 3, wherein at least one of the integrated circuits comprises a test controller circuit with parallel inputs for at least a bit of the synchronization data and a bit of the test data, test results and/or commands respectively, the at least one of the integrated circuits being arranged to update substantially simultaneously parallel supply to the test controller of the bit of synchronization data and the bit of the test data, test results and/or commands received serially via the chain.

6. An electronic circuit according to claim 1, wherein at least part of the integrated circuits contains an internal clock circuit for controlling programmable bit rates of reception and transmission of synchronization information and the test data, test results and/or commands, the bit rate of reception and transmission being at least partly independently programmable, the integrated circuits in said part being arranged to set the bit rate to a predetermined value in an initial state, and to reprogram one or more of the bit rates under control of an command received via the chain specifically for the integrated circuit.

7. An electronic circuit according to claim 6, wherein the integrated circuits of said at least part of the integrated circuits each have a clock input terminal, the clock input terminals being coupled in common to a test clock input of the electronic circuit, the integrated circuits of said at least part being arranged to derive the bit rate from the clock input terminal in the initial state, and from the clock circuit upon receiving a command to do so via the chain.

8. An electronic circuit according to claim 6, wherein the integrated circuits of said at least part of the integrated circuits each have an external reset input terminal, the reset input terminals being coupled in common to a test reset input of the electronic circuit, the reset terminals of the integrated circuits of said at least part being arranged reset the integrated circuit to the initial state in response to a reset signal at the reset terminal.

9. A test system comprising:
   An electronic circuit comprising:
      A plurality of integrated circuit, each comprising a test control circuit, switchable between a test mode and a normal operation mode;
      Functional connections between the integrated circuits;

Test communication connections in addition to the functional connections and forming a chain that includes the integrated circuits, the integrated circuits being arranged to receive and transmit, from one integrated circuit to another successively through the chain, test data, test results and/or commands together with synchronization information, for timing output of the test data to the functional connections and capture of the test results from the functional connections; and A tester coupled to an input and an output of the chain for supplying the test data and/or commands and for receiving the test results, wherein the tester is arranged to adjust a time interval after which the synchronization at the input is updated, dependent on a determination of a delay incurred by the synchronization information when the synchronization information travels through the chain, so that synchronization information that triggers the update arrives at the output of the chain before synchronization that triggers capture as applied at the input of the chain.

10. An integrated circuit, comprising:
a test control circuit, switchable between a test mode and a normal operating mode;
functional connections for connecting to external circuits;
a test input and a test output in addition to the functional connections, the integrated circuit being arranged to receive test data, test results and/or commands together with synchronization information at the test input, for timing output of the test data to the functional connections and capture of the test results from the functional connections, and to transmit test data, test results and/or commands together with synchronization information at the test output.

11. An integrated circuit according to claim 10, arranged to receive and transmit the synchronization information temporally in series with the test data, test results and/or commands through a same input communication conductor and a same output communication conductor respectively.

12. An integrated circuit according to claim 11, arranged to receive and transmit successive words that contain the synchronization information temporally in series with the test data, test results and/or commands, the integrated circuit being arranged to copy the synchronization information received from a received word to a transmitted word and to replace a received bit of the test data, test results and/or commands from the received word in the transmitted word by an internal bit of the test data, test results and/or commands, produced in the integrated circuit.

13. An integrated circuit according to claim 12, comprising a programmable circuit such as a programmable memory, the words containing one or more positions in addition to positions for the synchronization information and the test data, test results and/or commands, for transmitting programming information for programming the programmable circuit, the programmable circuit being coupled to receive the programming information from the chain.

14. An integrated circuit according to claim 12, arranged to receive and transmit the words, copying information from one or more positions in addition to positions for the synchronization information and the test data, test results and/or commands from received words to transmitted words.

15. An integrated circuit according to claim 12, arranged to step through a series of states, wherein successive states are selectable under control of the synchronization information, the states determining sequencing of update and capture.

16. An integrated circuit according to claim 11, wherein the test controller circuit has parallel inputs for a bit of synchronization data and a bit of the test data, test results and/or commands respectively, the synchronization information clocking processing of the bit of the test data, test results and/or commands, the integrated circuit comprising a shell supplying the bit of synchronization data and the bit of the test data, test results and/or commands received serially in parallel to the parallel inputs.

17. An integrated circuit according to claim 10, comprising a communication clock circuit for controlling programmable bit rates of reception and transmission of synchronization information and the test data, test results and/or commands, the bit rate of reception and transmission being at least partly independently programmable, the integrated circuit being arranged to set the bit rate to a predetermined value in an initial state, and to reprogram the bit rates under control of an integrated circuit specific command received via the chain.

18. An integrated circuit according to claim 17, having an external clock input terminal, the integrated circuit being arranged to derive the bit rate from the clock input terminal in the initial state, and from the clock circuit upon receiving a command to do so via the test input.

19. An integrated circuit according to claim 17, having an external reset input terminal, the integrated circuit being arranged reset to the initial state in response to a reset signal at the reset terminal.

20. A method of testing an electronic circuit that comprises a plurality of integrated circuits, interconnected by functional connections, the method comprising:
Providing test connections in addition to the functional connections, the test connections connecting the integrated circuits in a chain of successive integrated circuits;
Receiving and transmitting from one integrated circuit to another successively through the chain, test data, test results and/or commands together with synchronization information; and
Timing output of the test data to a functional connection and capture of the test results form the functional connections in each integrate circuit with the synchronization information received through the chain.

21. A method according to claim 20, comprising:
providing each integrated in the chain with a state machine circuit, for stepping through a series of states, entry into respective ones of the states controlling update and capture respectively, the synchronization information controlling which states the state machine circuit steps to and when;
copying the synchronization information that controls the states from one integrated circuit to another through the chain.

22. A method according to claim 20, comprising transmitting the synchronization information temporally in series with the test data, test results and/or commands through a same communication conductor from one integrated circuit to another.

23. A method according to claim 22, comprising:
receiving and transmitting successive words that contain the synchronization information temporally in series with the test data, test results and/or commands,
copying the synchronization information received from a received word to a transmitted word and to replace a received bit of the test data, test results and/or commands from the received word in the transmitted word by an internal bit of the test data, test results and/or commands, produced in the integrated circuit.

24. A method according to claim 22, comprising internally converting the received synchronization information temporally in series with the test data, test results and/or commands as to simulate reception of the synchronization information in parallel with the test data, test results and/or commands.

25. A method according to claim 22, comprising:
   initially using a common bit rate for communicating the transmission of synchronization information and the test data, test results and/or commands through the chain;
   sending a programming command through the chain to program a bit rate of a pair of successive integrated circuits in the chain;
   changing the bit rates for communicating the transmission of synchronization information and the test data, test results and/or commands the integrated circuits in the pair according to the command.

26. A method according to claim 25, comprising initially clocking transfer of information through the chain using a central clock connected in parallel to the integrated circuits of the chain, programming the bit rates of the transfer using commands transmitted through the chain and switching to clocking under control of the synchronization information that is transmitted through the chain after said programming.

27. A method according to claim 25, comprising resetting the integrated circuits to an initial state with said common bit rate using a central reset signal applied in parallel to the integrated circuits of the chain.

* * * * *